United States Patent [19]

Inoguchi et al.

[11] Patent Number: 5,292,685

[45] Date of Patent: Mar. 8, 1994

[54] METHOD FOR PRODUCING A DISTRIBUTED FEEDBACK SEMICONDUCTOR LASER DEVICE

[75] Inventors: Kazuhiko Inoguchi; Satoshi Sugahara; Mototaka Taneya; Hiroaki Kudo; Chitose Nakanishi; Haruhisa Takiguchi, all of Nara, Japan

[73] Assignee: Sharp Kabushiki Kaisha, Osaka, Japan

[21] Appl. No.: 919,665

[22] Filed: Jul. 24, 1992

[30] Foreign Application Priority Data

| Jul. 24, 1991 | [JP] | Japan | 3-184928 |
| Jul. 26, 1991 | [JP] | Japan | 3-187903 |
| Feb. 7, 1992 | [JP] | Japan | 4-022912 |

[51] Int. Cl.$^5$ .......................... H01L 21/203
[52] U.S. Cl. .................. 437/107; 437/129; 437/130; 156/610; 372/96
[58] Field of Search ............ 437/129, 130, 107, 133; 372/96, 45, 46

[56] References Cited

U.S. PATENT DOCUMENTS

| 4,023,993 | 5/1977 | Scifres et al. | 437/129 |
| 4,045,749 | 8/1977 | Burnham et al. | 372/96 |
| 4,575,919 | 3/1986 | Logan et al. | 372/43 |
| 4,716,132 | 12/1987 | Hirata | 437/129 |
| 4,718,604 | 1/1988 | Nakamura et al. | 437/129 |
| 4,745,615 | 5/1988 | Kaneiwa et al. | 372/96 |
| 4,745,616 | 5/1988 | Kaneiwa et al. | 372/96 |
| 4,847,844 | 7/1989 | Noda et al. | 372/45 |
| 4,852,116 | 7/1989 | Takiguchi et al. | 372/96 |
| 4,941,148 | 7/1990 | Yoshida et al. | 372/96 |
| 5,079,185 | 1/1992 | Kagawa et al. | 437/129 |

FOREIGN PATENT DOCUMENTS

| 0263690 | 4/1988 | European Pat. Off. | 372/96 |
| 59-103393 | 6/1984 | Japan | 437/129 |
| 60-164380 | 8/1985 | Japan . |
| 63-073683 | 4/1988 | Japan . |
| 63-156386 | 6/1988 | Japan | 437/129 |
| 63-263785 | 10/1988 | Japan . |
| 2-206191 | 8/1990 | Japan . |
| 2151401 | 7/1985 | United Kingdom | 372/96 |

OTHER PUBLICATIONS

"Low Threshold Current AlGaAs/GaAs Rib Waveguide Separate Confinement-Heterostructure Distributed-Feedback Lasers Grown by Metalorganic Chemical Vapor Deposition", Honda et al., *IEEE Journal of Quantum Electronics* (Jun. 1987) QE-23(6):8-39-842.

"Efficient AlGaAs Channeled-Substrate Planar Distributed Feedback Laser" Goldstein et al., *Appl. Phys. Lett.* (Aug. 15, 1988) 53(7):550–552.

Takigawa et al "Continuous Room Temperature Operation of a 759-nm GaAlAs Distributed Feedback Laser" Applied Phys. Lett. 51(20) 1580–1581 (Nov. 1987).

*Primary Examiner*—Olik Chaudhuri
*Assistant Examiner*—Ramamohan Rao Paladugu
*Attorney, Agent, or Firm*—Morrison & Foerster

[57] ABSTRACT

In a first crystal growth step, a first cladding layer, an active layer, and an optical wave-guide layer are sequentially grown on a semiconductor substrate. A diffraction grating is formed at a surface of the optical waveguide layer. In a second crystal growth step, a current block layer is grown on the optical waveguide layer having the diffraction grating. The current block layer is selectively etched to expose the diffraction grating and thus to form a stripe groove. In a third crystal growth step, a second cladding layer is grown on the diffraction grating inside the stripe groove and on the current block layer.

13 Claims, 16 Drawing Sheets

METHOD FOR PRODUCING A DISTRIBUTED FEEDBACK SEMICONDUCTOR LASER DEVICE

BACKGROUND OF THE INVENTION

1. Field of the Invention

The present invention relates to a method for producing a semiconductor laser device. In particular, the present invention relates to a method for producing a distributed feedback semiconductor laser device which is capable of stable control of the transverse mode to obtain a fundamental transverse mode even at a high output, and therefore is suitable for a light source for an optical data processing or an optical measuring instrument.

2. Description of the Prior Art

Recently, a semiconductor laser having the advantages of compactness, high output, and low cost has been put into practical use and applied to general industrial equipment and consumer equipment in which it has been difficult to use a conventional laser as a light source. The application of the semiconductor laser is especially remarkably advanced in the fields of optical data processing, optical measuring, and optical communication. It is expected that a semiconductor laser will be applied in more diverse fields in the future. Under these circumstances, it is demanded to further improve the inherent features of the laser such as coherency and monochromaticity of light and their stability, and thus to develop a semiconductor laser device having characteristics which are close to those of a gas laser. For example, a semiconductor laser device for application in a high speed laser printer has been developed.

For the application in a laser printer, a laser in which the transverse mode is controlled to obtain the fundamental transverse mode is required. In the optical system using a hologram or the like, a semiconductor laser, in which the transverse mode is controlled to obtain the fundamental transverse mode and the longitudinal mode is controlled to obtain the single longitudinal mode, is required. In response to these demands, a semiconductor laser device is proposed which has a diffraction grating formed in a resonator and thus selectively controls only the longitudinal mode corresponding to the Bragg wavelength of the diffraction grating. Such a semiconductor laser device is called a distributed feedback semiconductor laser device (hereinafter, referred to as DFB-LD). GaAs or InP semiconductor laser devices having such a construction have been developed.

Today, a semiconductor laser device using InP/InGaAsP materials and having a wavelength of 1.3 $\mu$m or 1.55 $\mu$m is practically used in a part of the optical communication field. The DFB-LD structure is employed in an AlGaAs/GaAs semiconductor laser device having a wavelength of 830 nm or shorter for use as a stable light source in a system utilizing a hologram or diffraction grating, for example, a hologram laser beam scanner and an integrated pickup for an optical disk.

A method for producing a DFB semiconductor laser device which includes a stripe groove and a light absorbing current block layer portions disposed on both sides of the stripe groove and thus controls the transverse mode is disclosed in Japanese Laid-Open Patent Publication No. 2-206191. According to this publication, a diffraction grating is formed in the semiconductor laser device in a simple method including only two crystal growth steps. This semiconductor laser device, which has a schematic construction shown in FIG. 7, is produced in the following manner.

In a first crystal growth step, as is shown in FIG. 8, an n-$In_{0.5}(Ga_{0.3}Al_{0.7})_{0.5}P$ first cladding layer 31, a non-doped $In_{0.5}Ga_{0.5}P$ active layer 32, a p-$In_{0.5}(Ga_{0.7}Al_{0.3})_{0.5}P$ optical waveguide layer 33, and an n-GaAs current block layer 34 are sequentially grown on an n-GaAs substrate 30 under a reduced-pressure by use of metal organic chemical vapor deposition (hereinafter, referred to as MOCVD).

Next, as is shown in FIG. 9, the current block layer 34 is etched by use of a chemical etching method, applying a photo resist mask until the optical waveguide layer 33 is exposed, thereby forming a stripe groove.

After the photo resist mask is removed by an appropriate solvent, the optical waveguide layer 33 inside the stripe groove is applied with another photo resist mask. A periodical corrugation is formed at the photo resist mask by use of holographic exposure, and then the periodical corrugation is transferred onto a surface of the optical waveguide layer 33 by use of a chemical etching method through this photo resist mask, thereby forming a diffraction grating 37 (FIG. 7).

In a second crystal growth step, as is shown in FIG. 10, a p-$In_{0.5}(Ga_{0.3}Al_{0.7})_{0.5}P$ second cladding layer 35 is grown on the optical waveguide layer 33 in the stripe groove and on the current block layer 34, and a p-GaAs contact layer 36 is grown on the second cladding layer 35, both by use of MOCVD.

Finally, a p-type electrode 38 is formed on a top surface of the contact layer 36, and an n-type electrode 39 is formed on a bottom surface of the substrate 30, and then the obtained wafer is cleaved into chips to produce the DFB semiconductor laser device shown in FIG. 7.

In the above DFB semiconductor laser device, portions of the light absorbing current block layer 34 disposed on both sides of the stripe groove controls the transverse mode. The longitudinal mode is controlled by the diffraction grating 37.

The above method has an advantage of producing the semiconductor laser device in only two crystal growth steps, but has the following problems.

It is extremely difficult to uniformly apply photo resist to form the photo resist mask for forming the diffraction grating on a bottom of the narrow groove sandwiched between the thick current block layers 34. For example, the photo resist tends to be thickly applied in the vicinity of the current block layer at the bottom of the groove. This portion is also hard to expose because the current block layer acts as a shielding wall, so the resist is not irradiated with UV light. Accordingly, it is impossible to form the diffraction grating in the vicinity of the current block layer on the bottom of the groove. In order to form a uniform diffraction grating at an entire bottom area of the stripe groove, the stripe groove acting as the waveguide region should be formed so as to have a width as wide as 10 $\mu$m or more. Such a wide waveguide region causes a deformation in the transverse mode due to spatial hole burning in the waveguide region, thereby adversely affecting the characteristics of the semiconductor laser device.

In the semiconductor laser device produced in the above method, the waveguide region in the vicinity of the current block layer without diffraction grating is thicker than the waveguide region at the central bottom portion of the stripe groove. Accordingly, the former portion has a larger equivalent refractive index than the latter portion. Since light is led to a portion having a larger refractive index, the former portion has a larger optical intensity distribution than the latter portion. As a result, the loss of light due to the light absorption effect of the current block layer is large, thereby excessively losing the light in the waveguide region in the fundamental transverse mode.

For these problems, the semiconductor laser device produced in the above prior art method is not always excellent in quality, resulting in a low production yield.

FIG. 21 shows a typical conventional AlGaAs/GaAs DFB semiconductor laser device having a mesa ridge and portions of a light absorbing current block layer disposed on both sides of the mesa ridge as a transverse mode controlling structure. This semiconductor laser device is produced, for example, in two crystal growth steps by use of MOCVD. An optical waveguide layer necessary for laser emission and a diffraction grating important for the DFB-LD structure are formed between the two crystal growth steps. Practically, this semiconductor laser device is produced in the following manner.

As is shown in FIG. 22, an n-AlGaAs first cladding layer 401 (thickness: 1.3 $\mu$m), an AlGaAs active layer 402 (thickness: 0.12 $\mu$m), and a p-AlGaAs optical waveguide layer 403 (thickness: 0.3 $\mu$m) are sequentially grown on an (100) facet of a n-GaAs substrate 400 by use of MOCVD. The resulting wafer is then taken out of a liquid phase epitaxy (hereinafter, referred to as LPE) apparatus, and a surface of the optical waveguide layer 403 is etched by an appropriate etching method to form a mesa ridge 404. The mesa ridge 404 has, for example, a width of approximately 3 $\mu$m and a height of approximately 0.15 $\mu$m. The mesa ridge 404 constitutes an optical waveguide region. As is shown in FIG. 23, a diffraction grating 405 is formed at an entire top surface of the optical waveguide layer 403 having the mesa ridge 404 by use of holographic exposure.

A p-AlGaAs second cladding layer 406 (thickness: 1.0 $\mu$m) and a p-GaAs contact layer 407 (thickness: 0.3 $\mu$m) are grown on the diffraction grating 405 by use of MOCVD. Then, a SiO$_2$ film 408 (thickness: 0.2 $\mu$m) is formed on the contact layer 407 by use of plasma chemical vapor deposition (P-CVD). A ortion of the SiO$_2$ film 408 positioned right above the mesa ridge 404 is etched away to form a window in a stripe pattern 409 (width: 3 $\mu$m). The current injection path is regulated by the stripe pattern.

Finally, a p-type ohmic electrode (not shown) is formed on a top surface of the contact layer 407 in the window 409, and an n-type ohmic electrode (not shown) is formed on a bottom surface of the substrate 400, and the resulting wafer is cleaved into chips to produce the DFB semiconductor laser device shown in FIG. 21.

The above method has the advantage of simplicity owing to only two crystal growth steps required, but has the following problems.

Since the positional alignment of the mesa ridge 404 and the window 409 should be performed so that the gain generated by current injection is largest at the center of the optical waveguide region in the transverse direction, an extremely high precision (generally, an error of 0.1 $\mu$m or less) is required. Practically, since the mesa ridge 404 is buried by the second cladding layer 406 and the contact layer 407, such a highly precise alignment is extremely difficult. When the current injection path and the optical waveguide region are even slightly deviated in position from each other, the control of the transverse mode is ineffective. Since an effective refractive index waveguide is utilized in order to control the transverse mode in this semiconductor laser device, a higher order mode or an asymmetrical mode light cannot be reduced. Especially in the high optical output operation, the peak of the emitted laser intensity distribution is easily deviated from the center of the waveguide region.

In forming the diffraction grating 405, it is necessary to apply resist on a surface of the optical waveguide layer 403 on which the mesa ridge 404 is formed and then expose the resist so as to have a stripe pattern. Since the thickness of the resist film is non-uniform at the vicinity of the foot of the mesa ridge 404, it is difficult to determine appropriate exposure conditions. Accordingly, the diffraction grating cannot be formed to have a uniform thickness.

In order to solve these problems, still another method for producing a DFB semiconductor laser in which a diffraction grating is formed on an entire surface of the flat wafer is proposed in Japanese Laid-Open Patent Publication No. 2-206191. The semiconductor laser device according to this publication is shown in FIG. 24, and is produced in the following manner.

An n-InGaAlP first cladding layer 501, an InGaP active layer 502, and a p-InGaAlP optical waveguide layer 503 are sequentially grown on an n-GaAs substrate 500. Next, a diffraction grating 504 is formed at an entire top surface of the optical waveguide layer 503, and then a p-InGaAlP second cladding layer 505 is grown on the diffraction grating 504. The second cladding layer 505 is etched by use of a thin film mask formed of a dielectric material to form a mesa ridge 506. The thin film mask formed of the dielectric material is used again to grow a current block layer 507 on the optical waveguide layer 503 provided on both sides of the mesa ridge 506. Then, the dielectric thin film mask is removed, and a p-GaAs contact layer 508 is grown on the mesa ridge 506 and the current block layer 507. Finally, a p-type ohmic electrode 509 is formed on a top surface of the contact layer 508, and an n-type ohmic electrode 510 is formed on a bottom surface of the substrate 500. Thus, the DFB semiconductor laser device shown in FIG. 24 is produced. In this prior art example, all the layers are grown by use of MOCVD.

In the DFB semiconductor laser device having the mesa ridge shown in FIG. 24, the diffraction grating is formed at the entire surface of the optical waveguide layer. Therefore, this semiconductor laser device is more excellent than the one in FIG. 7 in the control precision of the manufacturing process. On the other hands, this semiconductor laser device has problems that a dielectric film should be used as a mask to selectively grow the current block layer and that four crystal growth steps are required to grow the contact layer, resulting in a low production yield.

SUMMARY OF THE INVENTION

The method for producing a distributed feedback semiconductor laser device including a structure for controlling a longitudinal mode of light to be emitted and a structure for controlling a transverse mode of the light according to the present invention includes a first crystal growth step of sequentially growing a first cladding layer of a first conductive type, an active layer, and an optical waveguide layer of a second conductive type on a semiconductor substrate of the first conductive type; a step of forming a diffraction grating at a surface of the optical waveguide layer; a second crystal growth step of growing a current block layer of the first conductive type on the optical waveguide layer having the diffraction grating; a step of selectively etching the current block layer to expose the diffraction grating and thus to form a stripe groove; and a third crystal growth step of growing a second cladding layer of the second conductive type on the diffraction grating inside the stripe groove and on the current block layer.

Alternatively, the method according to the present invention includes a first crystal growth step of sequentially growing a first cladding layer of a first conductive type, an active layer, and an optical waveguide layer of a second conductive type on a semiconductor substrate of the first conductive type; a step of forming a diffraction grating at a surface of the optical waveguide layer; a second crystal growth step of sequentially growing a first semiconductor layer of the second conductive type and a current block layer of the first conductive type on the optical waveguide layer having the diffraction grating; a step of selectively etching the current block layer to expose the first semiconductor layer and thus to form a stripe groove; and a third crystal growth step of growing a second semiconductor layer of the second conductive type on the first semiconductor layer inside the stripe groove and on the current block layer to form a second cladding layer.

Alternatively, the method according to the present invention includes a first crystal growth step of sequentially growing a first cladding layer of a first conductive type, an active layer, and an optical waveguide layer of a second conductive type on a semiconductor substrate of the first conductive type; a step of forming a diffraction grating at a surface of the optical waveguide layer; a second crystal growth step of growing a second cladding layer of the second conductive type on the optical waveguide layer having the diffraction grating; a step of selectively etching the second cladding layer to expose the diffraction grating and thus to form a mesa ridge; and a third crystal growth step of selectively growing a current block layer of the first conductive type on the optical waveguide layer disposed on both sides of the mesa ridge.

Thus, the invention described herein makes possible the advantages of providing (1) a method for producing a DFB semiconductor laser device having a structure for controlling a longitudinal mode and a structure for controlling a transverse mode, which improves the emission characteristics of the produced semiconductor laser device and enhances the production yield and (2) a method for producing a DFB semiconductor laser device having a structure for controlling a longitudinal mode and a structure for controlling a transverse mode, which reduces the number of the production steps and enhances the production yield.

These and other advantages of the present invention will become apparent to those skilled in the art upon reading and understanding the following detailed description with reference to the accompanying FIGURES.

DETAILED DESCRIPTION OF THE PREFERRED EMBODIMENTS

Hereinafter, the present invention will be described by way of illustrating examples with reference to the accompanying drawings. In the following examples, AlGaAs compounds are used as semiconductor materials.

Example 1

Figure 1:
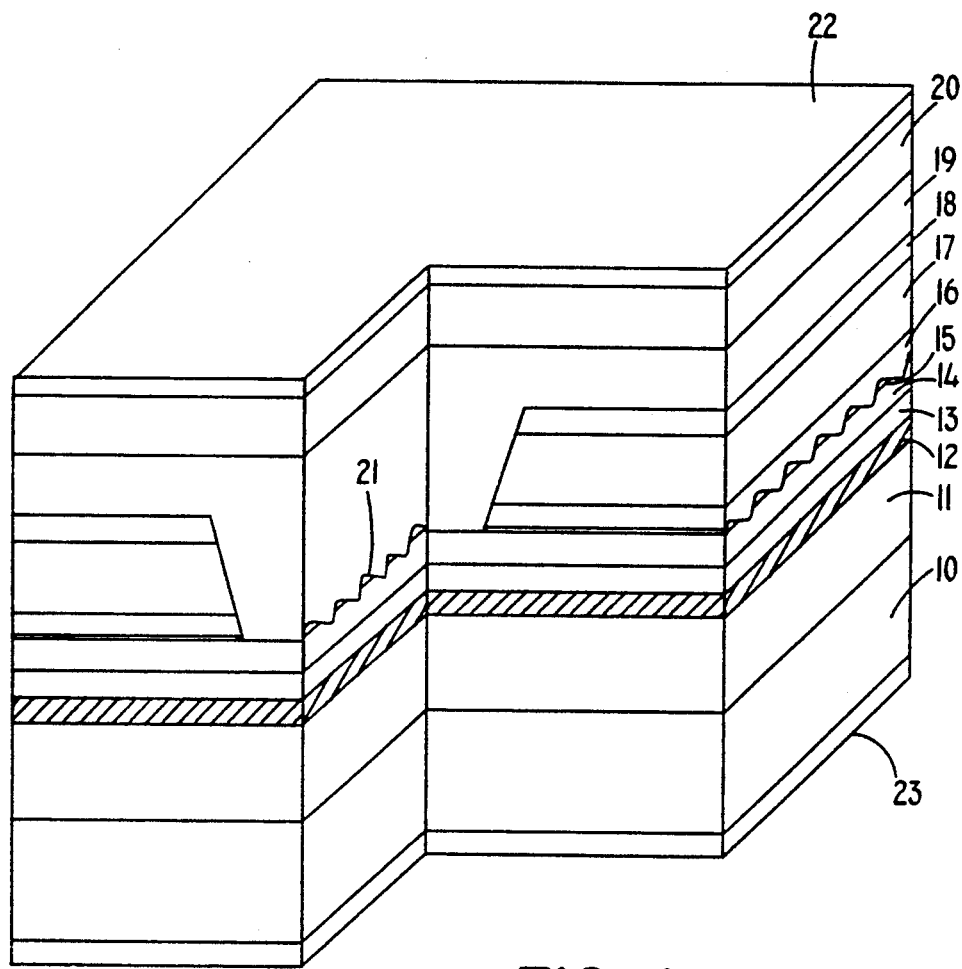
FIG. 1 is a partially cut schematic perspective view of a DFB semiconductor laser device produced in accordance with Example 1 of the present invention.

FIG. 1 shows a schematic construction of a DFB semiconductor laser device produced in accordance with Example 1 of the present invention.

The DFB semiconductor laser device of Example 1 includes an n-GaAs substrate 10, an n-$Al_{0.5}Ga_{0.5}As$ first cladding layer 11 (thickness: 1.0 μm), a non-doped $Al_{0.13}Ga_{0.87}As$ active layer 12 (thickness: 0.08 μm), a p-$Al_{0.5}Ga_{0.5}As$ carrier barrier layer 13 (thickness: 0.05 μm), a p-$Al_{0.25}Ga_{0.75}As$ optical waveguide layer 14 (thickness: 0.15 μm), and a p-GaAs support layer 15 (thickness: 3 nm), which are sequentially laminated. The optical waveguide layer 14 has a periodical corrugation as a diffraction grating 21 at an entire top surface thereof. The support layer 15 is provided for protecting the diffraction grating 21 and also for promoting the growth of a layer which is to be laminated thereon. In Example 1, the support layer 15 is formed only on peaks of the diffraction grating 21. On the support layer 15, an n-$Al_{0.6}Ga_{0.4}As$ etching stop layer 16 (thickness: 0.02 to 0.05 μm), an n-GaAs current block layer 17 (thickness: 0.5 μm), and an n-$Al_{0.05}Ga_{0.95}As$ support layer 18 (thickness: 0.1 μm) are sequentially laminated. The support layer 18 is provided for promoting a layer which is to be laminated thereon. This laminate has a stripe groove in a central portion thereof extended from the etching stop layer 16 through the support layer 18. On the diffraction grating 21 inside the stripe groove and on the current block layer 17 having the support layer 18 thereon, a p-$Al_{0.7}Ga_{0.3}As$ second cladding layer 19 (thickness: 2 μm) is laminated. A p-GaAs contact layer 20 (thickness: 1 μm) is laminated on the second cladding layer 19. The p-GaAs contact layer 20 has a p-type electrode 22 on a top surface thereof, and the n-GaAs substrate 10 has an n-type electrode 23 on a bottom surface thereof.

In the DFB semiconductor laser device having the above construction, the current block layer 17 provided in the vicinity of the active layer 12 functions as an optical absorption layer. Therefore, the complex index of refraction inside the stripe groove is different from that of outside the stripe groove, thereby confining light in a horizontal direction. Moreover, since the current is confined without a leak owing to the current block layer 17, laser emission is possible even at a low threshold current.

Due to the diffraction grating 21 dispose inside the stripe groove, light is amplified only in the longitudinal direction of the resonator, and when the current reaches a certain threshold, the laser light is emitted. The wavelength of the emitted light is expressed by the following formula:

$$\lambda = 2 \cdot n_{eff} \Lambda / m \quad (m = 1, 2, 3, \ldots)$$

where $n_{eff}$ is the equivalent refractive index, and $\Lambda$ is the period of the diffraction grating 21. As is apparent from the formula, the wavelength λ can be changed by varying the period $\Lambda$ of the diffraction grating 21.

A method for producing the DFB semiconductor laser of Example 1 will be described with reference to FIGS. 2 through 6.

Figure 2:
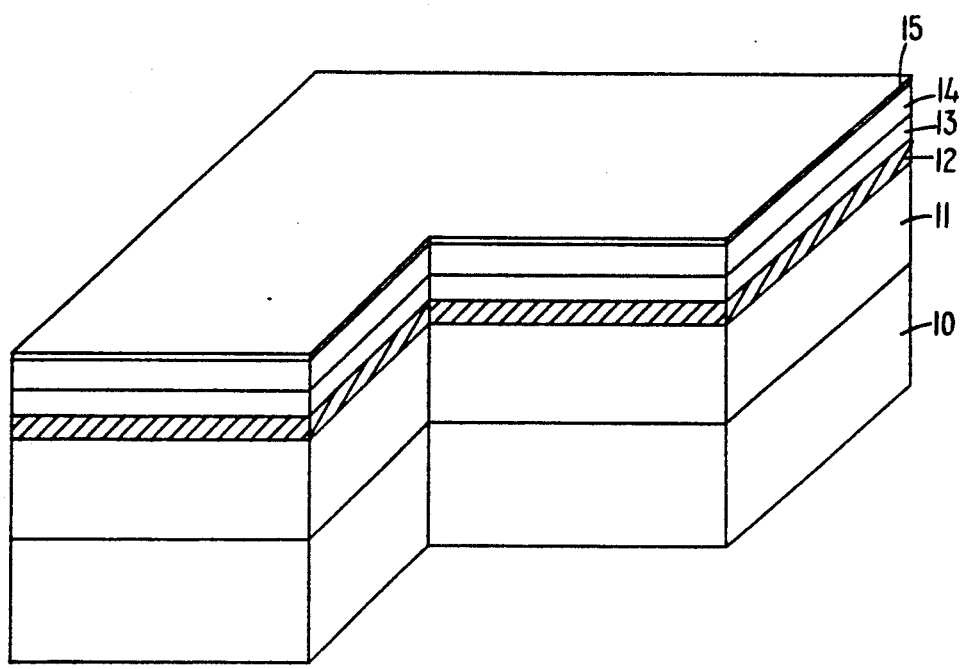
FIG. 2 is a partially cut perspective view illustrating a first crystal growth step for producing the DFB semiconductor laser device of FIG. 1.

In a first crystal growth step, as is shown in FIG. 2, the first cladding layer 11, the active layer 12, the carrier barrier layer 13, the optical waveguide layer 14, and the support layer 15 are sequentially grown on a (100) facet of the substrate 10. These layers are formed of organic metals including III group elements (trimethyl gallium and trimethyl aluminum) and hydrides including V group elements (arsine and phosphine) by use of MOCVD under a reduced pressure of 100 Torr.

Figure 3:
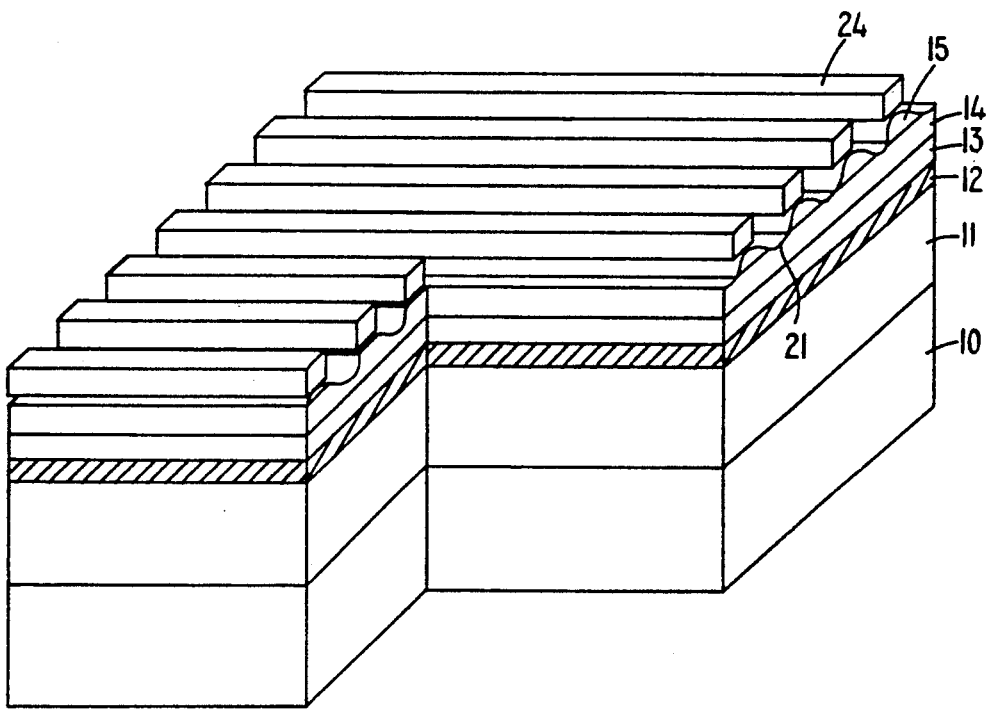
FIG. 3 is a partially cut perspective view illustrating a step of forming a diffraction grating at a surface of an optical waveguide layer for producing the DFB semiconductor laser device of FIG. 1.

Next, as is shown in FIG. 3, the support layer 15 is coated with a photo resist film 24 (thickness: 100 nm), and then the photo resist film 24 is treated with holographic exposure to form a corrugation having a period of, for example, 3,468 Å. The periodical corrugation of the photo resist film 24 is transferred onto the optical waveguide layer 14 by use of a chemical etching method to form the diffraction grating 21 having a depth of 0.1 μm. Then, the photo resist film 24 is removed by use of an appropriate solvent. At this point, the support layer 15 remains on the peaks of the diffraction grating 21.

Figure 4:
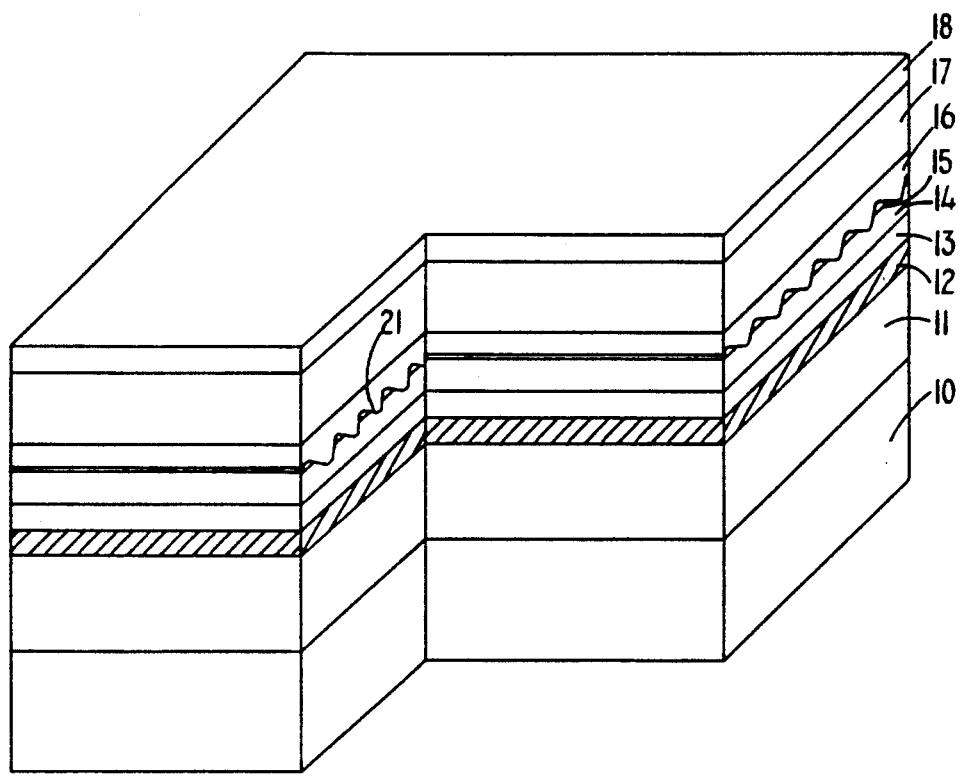
FIG. 4 is a partially cut perspective view illustrating a second crystal growth step for producing the DFB semiconductor laser device of FIG. 1.

In a second crystal growth step, as is shown in FIG. 4, the etching stop layer 16, the current block layer 17, and the support layer 18 are sequentially grown on the optical waveguide layer 14 having the diffraction grating 21 and on the support layer 15 by use of MOCVD.

Figure 5:
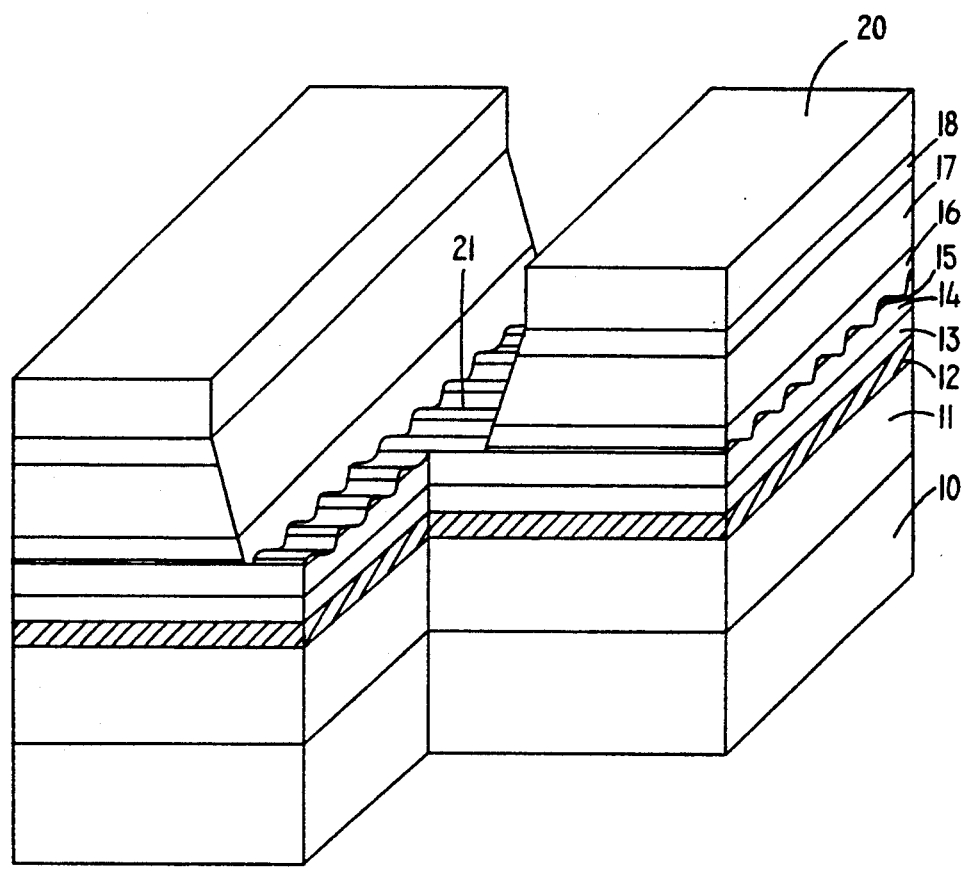
FIG. 5 is a partially cut perspective view illustrating a step of forming a stripe groove for producing the DFB semiconductor laser device of FIG. 1.

Next, as is shown in FIG. 5, the support layer 18 is coated with a photo resist film 25 (thickness: 300 nm). A central portion of the photo resist film 25 is removed in a stripe pattern by use of photolithography and etching, thereby forming a photo resist mask. The current block layer 17 and the support layer 18 are etched through the photo resist mask by use of a chemical etching method with an ammonia-type etchant until the etching stop layer 16 is exposed. The etching stop layer 16 prevents the optical waveguide layer 14 from being etched.

Then, the etching stop layer 16 is etched away by use of a chemical etching method with hydrogen fluoride (HF) to expose the optical waveguide layer 14. In this way, the stripe groove having a bottom width of 4 μm is formed. At this point, the diffraction grating 21 is exposed at the bottom of the stripe groove. The photo resist film 25 is removed by use of an appropriate solvent.

Figure 6:
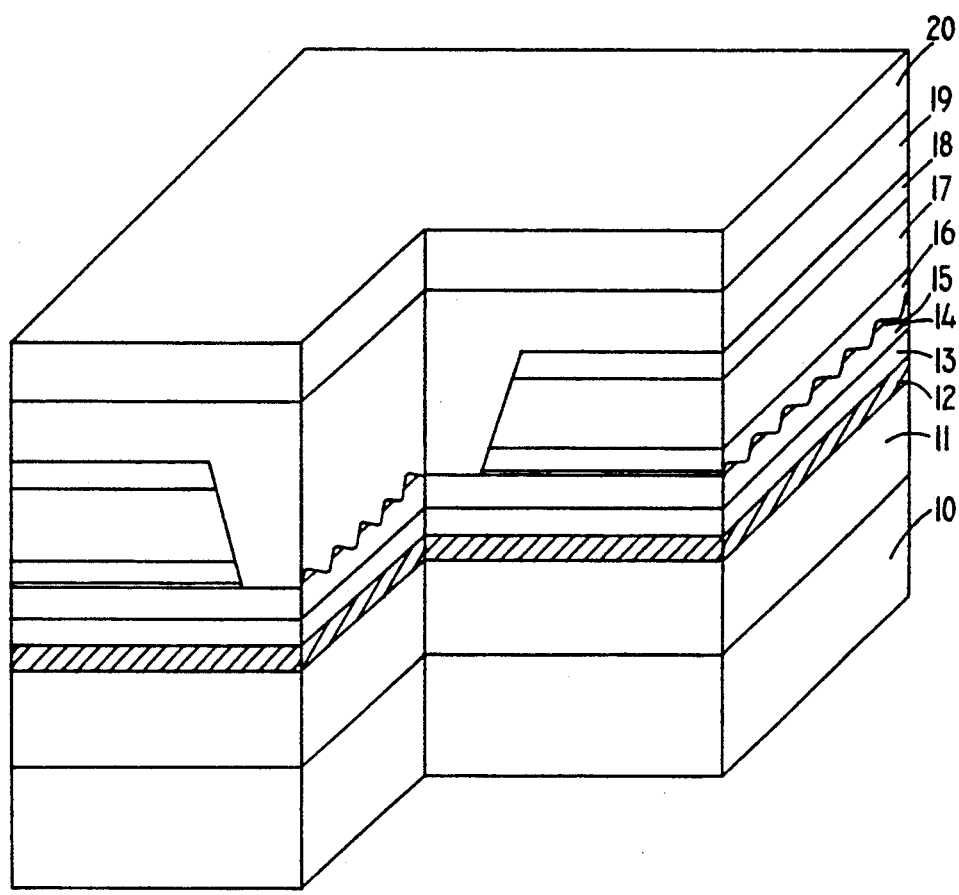
FIG. 6 is a partially cut perspective view illustrating a third crystal growth step for producing the DFB semiconductor laser device of FIG. 1.
Figure 7:
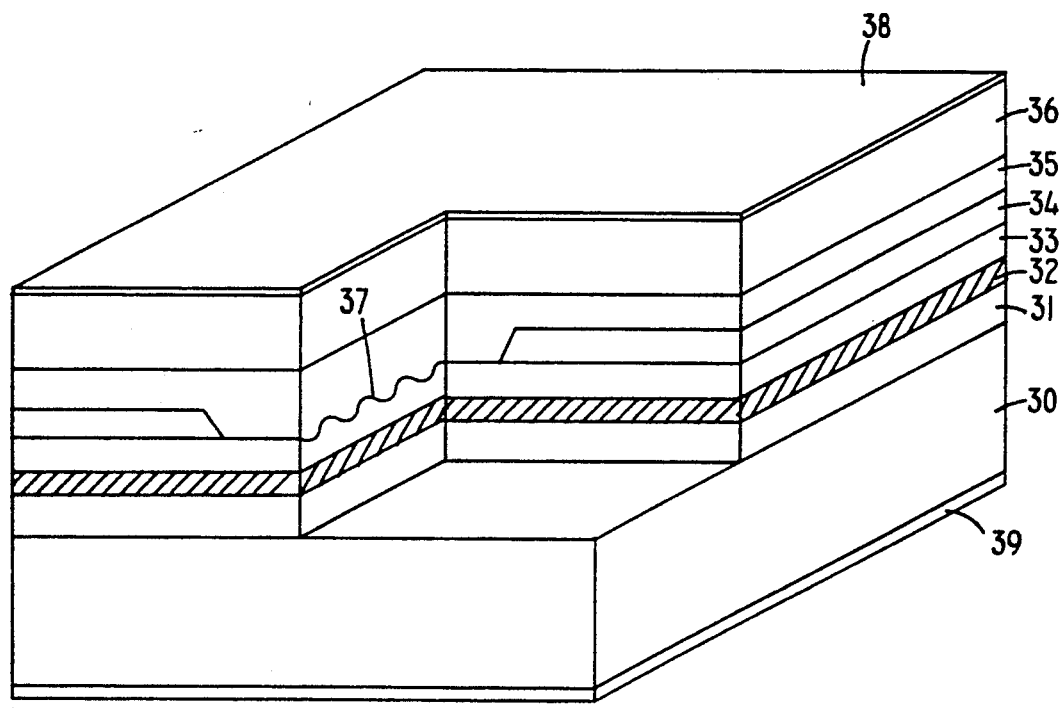
FIG. 7 is a partially cut schematic perspective view of a prior art DFB semiconductor laser device.
Figure 8:
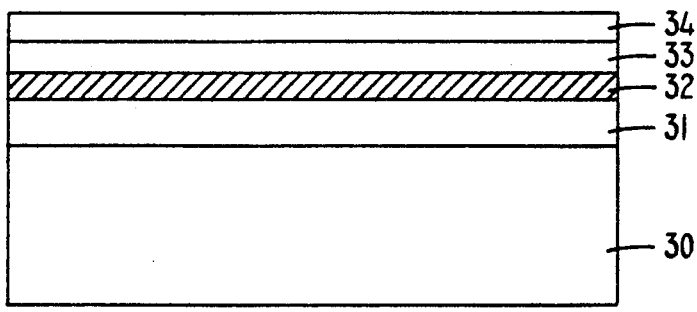
FIG. 8 is a cross sectional view illustrating a first crystal growth step for producing the prior art DFB semiconductor laser device of FIG. 7.
Figure 9:
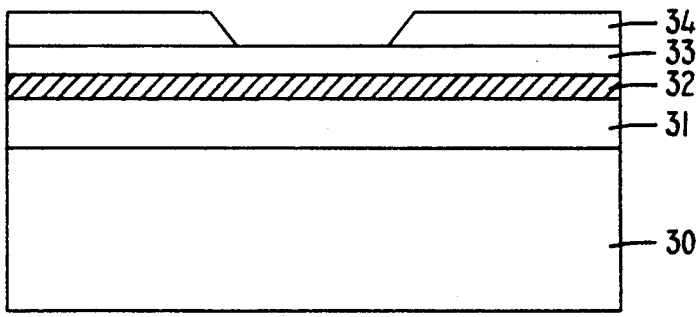
FIG. 9 is a cross sectional view illustrating a step of forming a stripe groove for producing the prior art DFB semiconductor laser device of FIG. 7.
Figure 10:
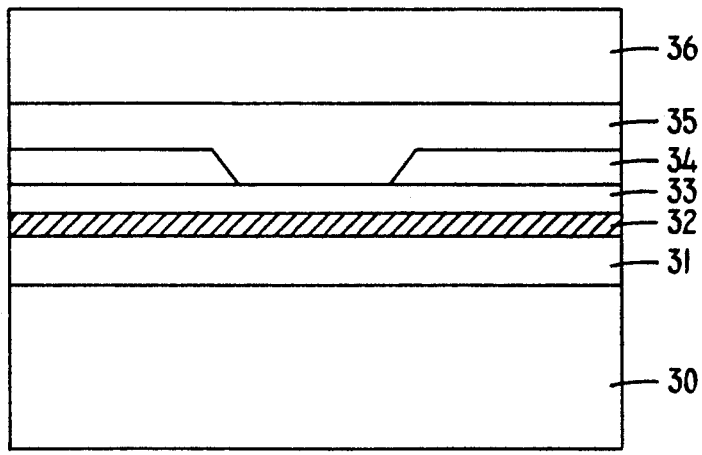
FIG. 10 is a cross sectional view illustrating a second crystal growth step for producing the prior art DFB semiconductor laser device of FIG. 7.

In a third crystal growth step, as is shown in FIG. 6, the second cladding layer 19 is grown by use of LPE on the optical waveguide layer 14 inside the stripe groove and on the support layer 18, and then the contact layer 20 is grown on the second cladding layer 19 again by use of LPE. Owing to the support layer 15 remaining on the peaks of the diffraction grating 21 and the support layer 18 existing on the current block layer 17, the second cladding layer 19 can easily be grown inside the stripe groove.

Finally, the p-type electrode 22 and the n-type electrode 23 are respectively formed on the top surface of the contact layer 20 and the bottom surface of the substrate 10. The resulting wafer is cleaved into chips to produce the DFB semiconductor laser device shown in FIG. 1.

The above DFB semiconductor laser device is produced so as to have a resonator length of 250 μm. The threshold current is 40 mA, and stable control of the longitudinal mode is realized even at an output power of 10 mW or more.

According to Example 1, after the periodical corrugation which acts as a diffraction grating is formed at an entire surface of the optical waveguide layer, the stripe groove for controlling the transverse mode is formed so as to have the diffraction grating at an entire bottom area thereof. Therefore, a uniform diffraction grating is formed at the entire bottom area of the stripe groove. Thus, a DFB semiconductor laser device having a structure for controlling the transverse mode with high stability and also having a structure for controlling the longitudinal mode can easily be produced with a very high production yield.

Moreover, by forming the support layer 15 on the diffraction grating 21, the production yield of growing the second cladding layer 19 inside the stripe groove is considerably improved.

The DFB semiconductor laser devices produced in accordance with Example 1 have uniform emission characteristics and can be provided at a low cost, and so can widely be used as a light source for optical data processing or optical measuring instruments.

In the DFB semiconductor laser device of Example 1, the semiconductor layer used as a base and the semiconductor layer grown thereon may be of an identical conductive type. For example, the etching stop layer 16 may be of p-type identical with the optical waveguide layer 14 used as the base thereof in the second crystal growth step. The support layer 18 may be of p-type identical with the second cladding layer 19 which is grown above the support layer 18 in the third crystal growth step.

In this modified construction, in each of the second and the third crystal growth steps, a layer used as a base and another layer grown thereon are of an identical conductive type. Moreover, the interfaces between the layers in both of the steps are also of the identical conductive type. In addition to the above advantages of Example 1, a DFB semiconductor laser device having such a modified construction has another advantage: an extremely smaller number of defects generated at the interface between the base layer and the layer grown thereon, compared with the DFB semiconductor laser device in which a layer used as a base and another layer grown thereon are of different conductive types. In this modified example, therefore, no leak current flows in the current block layer through a crystal defect. Thus, a semiconductor layer device having excellent characteristics with a low emission threshold current can be produced.

Example 2

Figure 11:
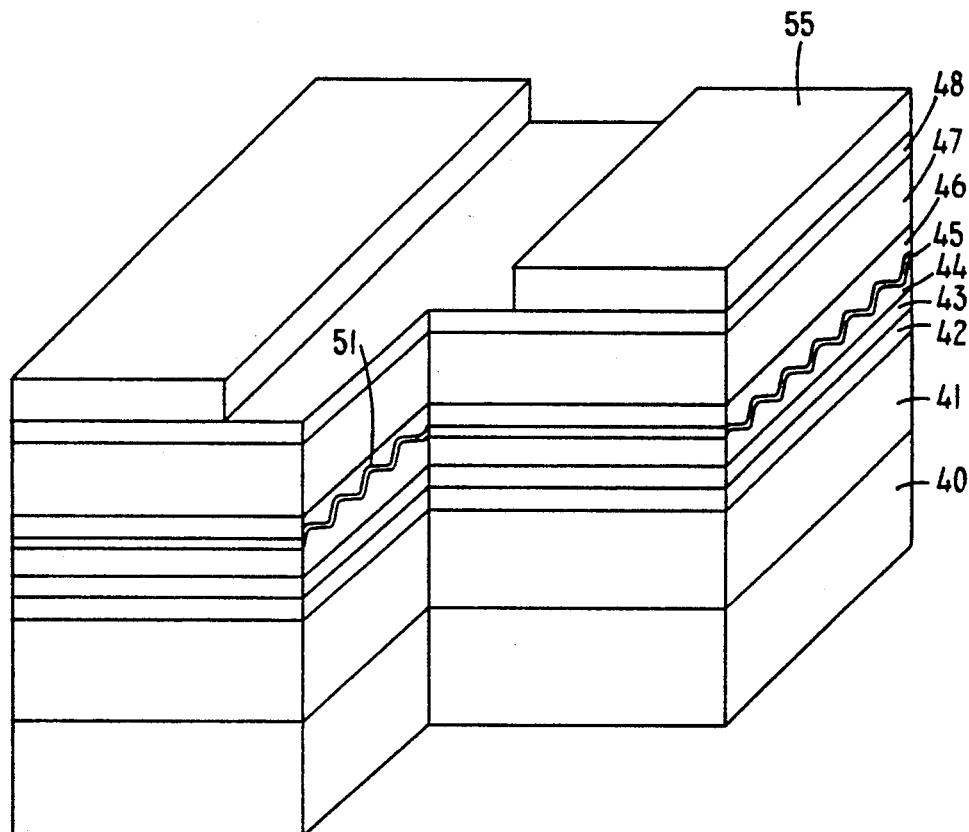
FIG. 11 is a partially cut perspective view illustrating a second crystal growth step for producing a DFB semiconductor laser device produced in accordance with Example 2 of the present invention.

A DFB semiconductor laser device produced in accordance with Example 2 of the present invention will be described with reference to FIGS. 11 and 12. FIG. 11 shows a laminate substantially corresponding to that of FIG. 4 of Example 1. In FIG. 11, a photo resist film 55 is formed but a stripe groove has not yet been formed.

The laminate shown in FIG. 11 includes an n-type substrate 40, an n-type first cladding layer 41, an active layer 42, a carrier barrier layer 43, and a p-type optical waveguide layer 44 which are sequentially laminated. The optical waveguide layer 44 has a diffraction grating 51 at an entire top surface thereof.

A support layer 45 having a substantially uniform thickness is laminated to cover the entire surface of the optical waveguide layer 44 having the diffraction grating 51. The support layer 45 is provided for protecting the diffraction grating 51 and also for promoting the growth of a layer which is to be laminated thereon. An etching stop layer 46, a current block layer 47, and a support layer 48 are sequentially laminated on the support layer 45. The support layer 48 is provided for promoting a layer which is to be laminated thereon. The support layer 48 is coated with the photo resist film 55, and a central portion thereof is removed in a stripe pattern. The above layers correspond to the layers of Example 1 having the identical names, and are formed of the identical materials, respectively.

The lamination shown in FIG. 11 is produced in the following manner.

In a first crystal growth step, the first cladding layer 41, the active layer 42, the carrier barrier layer 43, and the optical waveguide layer 44 are sequentially grown on the substrate 40. The diffraction grating 51 is formed at the top surface of the optical waveguide layer 44

In a second crystal growth step, the support layer 45 is grown on an entire surface of the diffraction grating 51, and then the etching stop layer 46, the current block layer 47, and the epitaxial support layer 48 are sequentially grown. These layers and the diffraction grating 51 are formed in the same manner as in Example 1 except that the support layer 45 is grown in the second crystal growth step.

Figure 12:
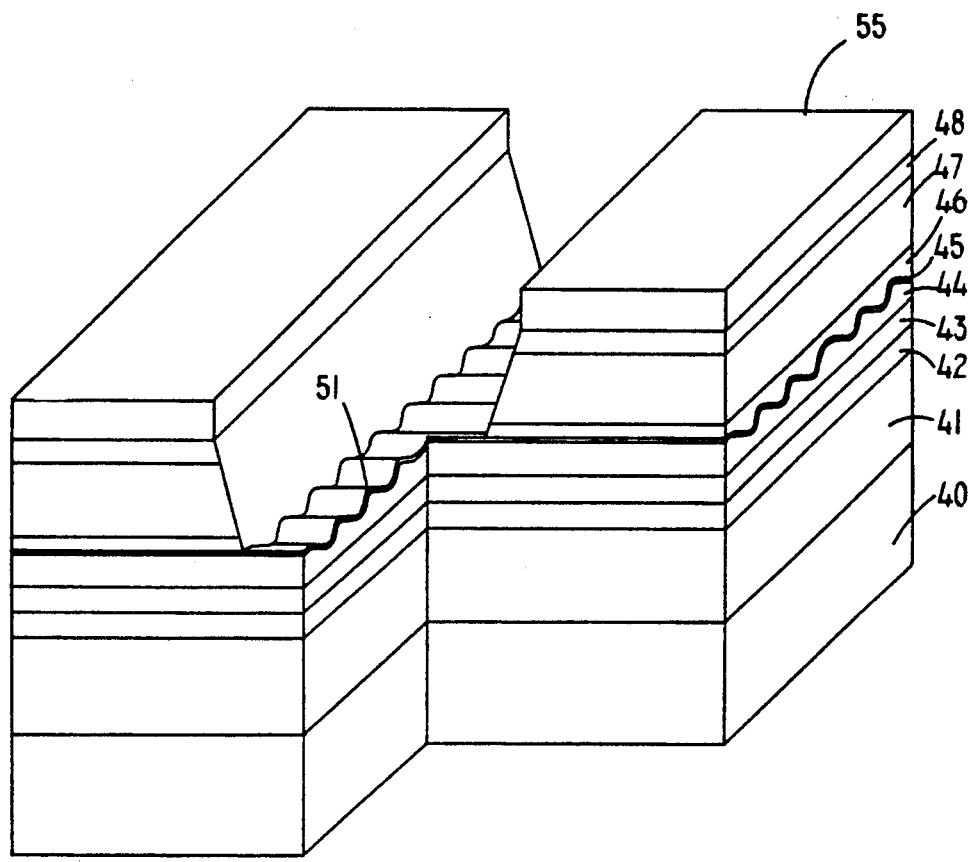
FIG. 12 is a partially cut perspective view illustrating a step of forming a stripe groove for producing the DFB semiconductor laser device of FIG. 11.

The photo resist film 55 is formed and patterned in the same manner as in Example 1 and is used to form a stripe groove having a bottom width of 3 μm by use of an etching method as is shown in FIG. 12. The support layer 45 is exposed at a bottom of the groove.

Then, a second cladding layer (not shown), a contact layer (not shown), and electrodes (not shown) are formed in the same manner as in Example 1, thereby producing the DFB semiconductor laser device of Example 2.

In the DFB semiconductor laser device of Example 2, the support layer 45 having a substantially uniform thickness is formed on the diffraction grating 51. Accordingly, the second cladding layer can more easily be grown inside the stripe groove. Namely, the DFB semiconductor device has a high production yield.

The DFB semiconductor laser device of Example 2 is produced to have a resonator length of 250 μm. The threshold current is 40 mA, and stable control of the longitudinal mode is realized even at an output power of 10 mW or more.

According to Example 2, after the periodical corrugation which acts a diffraction grating is formed at an entire surface of the optical waveguide layer, the stripe groove for controlling the transverse mode is formed so as to have the diffraction grating at an entire bottom area thereof. Therefore, a uniform diffraction grating is formed at the entire bottom area of the stripe groove. This is an advantage over the prior art method for the following reason. Since the optical waveguide region is identical with the stripe groove, the positional alignment of the electrodes and the optical waveguide region is very easy, resulting in a high production yield. Thus, a DFB semiconductor laser device having a structure for controlling the transverse mode with high stability and also having a structure for controlling the longitudinal mode can easily be produced with a very high production yield.

By forming the support layer 45 in a substantially uniform thickness, the yield of growing the second cladding layer can further be enhanced.

Example 3

Figure 13:
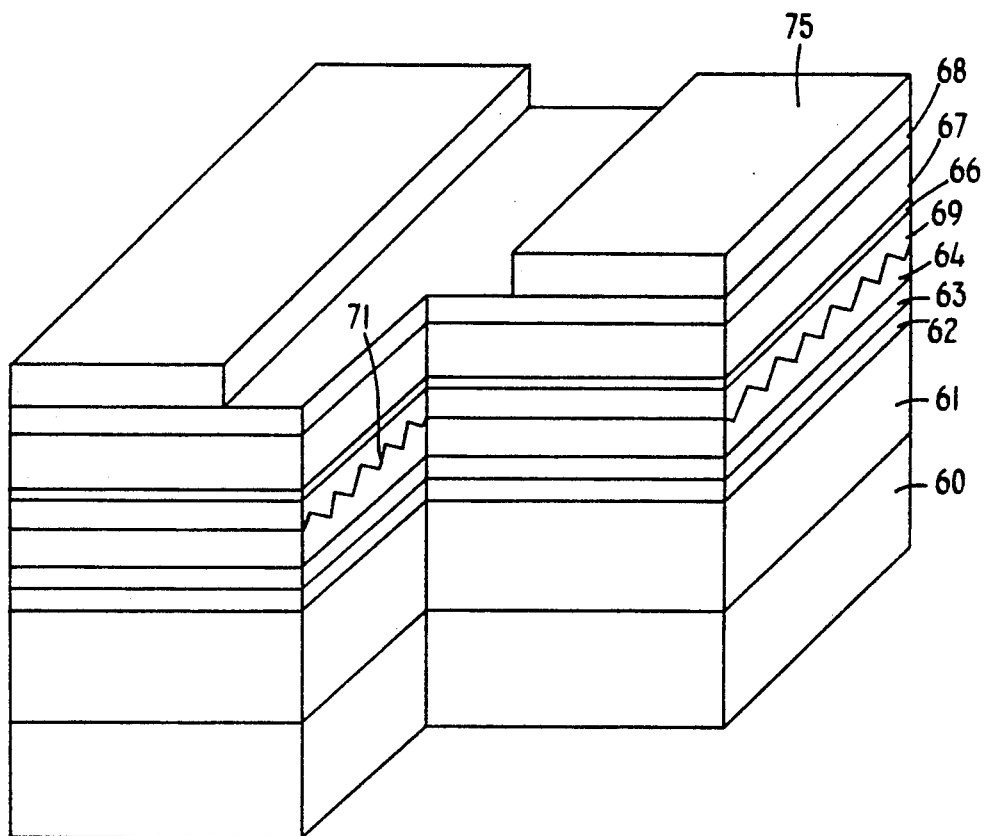
FIG. 13 is a partially cut perspective view illustrating a second crystal growth step for producing a DFB semiconductor laser device produced in accordance with Example 3 of the present invention.
Figure 14:
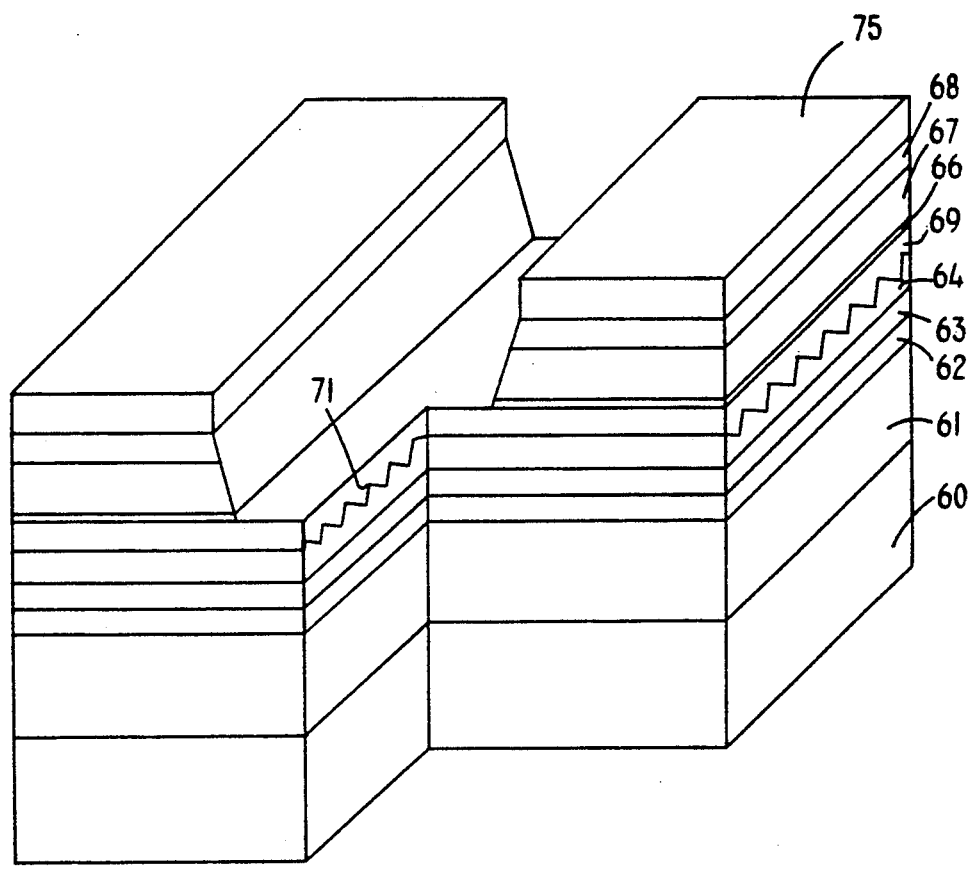
FIG. 14 is a partially cut perspective view illustrating a step of forming a stripe groove for producing the DFB semiconductor laser device of FIG. 13.

A DFB semiconductor laser device produced in accordance with Example 3 of the present invention will be described with reference to FIGS. 13 and 14. FIGS. 13 and 14 show laminates substantially corresponding to those of FIGS. 11 and 12 of Example 2, respectively.

The laminate shown in FIG. 13 includes an n-type substrate 60, an n-type first cladding layer 61, an active layer 62, a carrier barrier layer 63, and a p-type optical waveguide layer 64 which are sequentially laminated. The optical waveguide layer 64 has a diffraction grating 71 at an entire top surface thereof. The diffraction grating 71 has a sawtooth-like corrugation in Example 3.

On the optical waveguide layer 64 having the diffraction grating 71, a p-type semiconductor layer 69 which is to be a part of a second cladding layer (described later). An etching stop layer 66, a current block layer 67, and a support layer 68 are sequentially laminated on the semiconductor layer 69. The support layer 68 is provided for promoting the growth of a layer which is to be laminated thereon. The support layer 68 is covered with a photo resist film 75, and a central portion thereof is removed in a stripe pattern. The above layers correspond to the layers of Example 1 having the identical names, and are formed of identical materials, respectively.

The laminate shown in FIG. 13 is produced in the following manner.

In a first crystal growth step, the first cladding layer 61, the active layer 62, the carrier barrier layer 63, and the optical waveguide layer 64 are sequentially grown on the substrate 60, and the diffraction grating 71 is formed at the top surface of the optical waveguide layer 64.

In a second crystal growth step, the p-type semiconductor layer 69 is grown on an entire surface of the diffraction grating 71, and then the etching stop layer 66, the current block layer 67, and the support layer 68 are sequentially grown. These layers and the diffraction grating 71 are formed in the same manner as in Example 1.

The photo resist film 75 is formed and patterned in the same manner as in Example 1 and is used to form the stripe groove by use of etching as is shown in FIG. 14. The p-type semiconductor layer 69 is exposed at a bottom of the stripe groove.

Then, another semiconductor layer (not shown) of the p-type identical with the semiconductor layer 69 is grown inside the stripe groove to form the second cladding layer. Further, a contact layer (not shown) and electrodes (not shown) are formed in the same manner as in Example 1, thereby producing the DFB semiconductor laser device of Example 3.

In the DFB semiconductor laser device of Example 3, the semiconductor layer 69 which is a part of the second cladding layer is grown on the diffraction grating 71. Accordingly, the diffraction grating 71 is desirably prevented from deteriorating when the second cladding layer is grown.

The DFB semiconductor laser device of Example 3 is produced so as to have a resonator length of 250 μm. The threshold current is 40 mA, and stable control of the longitudinal mode is realized even at an output power of 10 mW or more.

By forming a layer used as a base and another layer grown thereon of materials of an identical conductive type, the same effect can be obtained as in Example 1.

According to Example 3, the semiconductor layer 69 of the same conductive type as the optical waveguide layer 64 is formed at the bottom of the stripe groove, and another semiconductor layer of the same conductive type is grown to form the second cladding layer. Since the diffraction grating 71 is not exposed in forming the second cladding layer by this construction, the diffraction grating 71 can be protected from deterioration. Thus, a DFB semiconductor laser device having a structure for controlling the transverse mode with high stability and also having a structure for controlling the longitudinal mode can be produced with a very high yield.

In Examples 1, 2, and 3, the layers are grown mainly by use of MOCVD. Instead of MOCVD, chemical vapor deposition (CVD), molecular beam epitaxy (MBE), gas source MBE, or LPE may also be used.

Example 4

Figure 15:
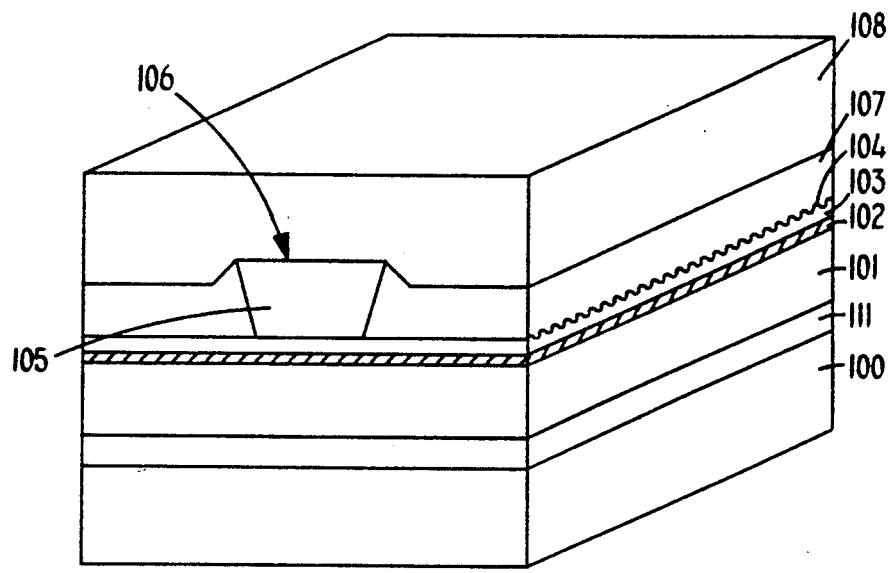
FIG. 15 is a schematic perspective view of a DFB semiconductor laser device produced in accordance with Example 4 of the present invention.

FIG. 15 shows a schematic construction of a DFB semiconductor laser device produced in accordance with Example 4 of the present invention. This DFB semiconductor laser device is produced in the following manner.

Figure 16:
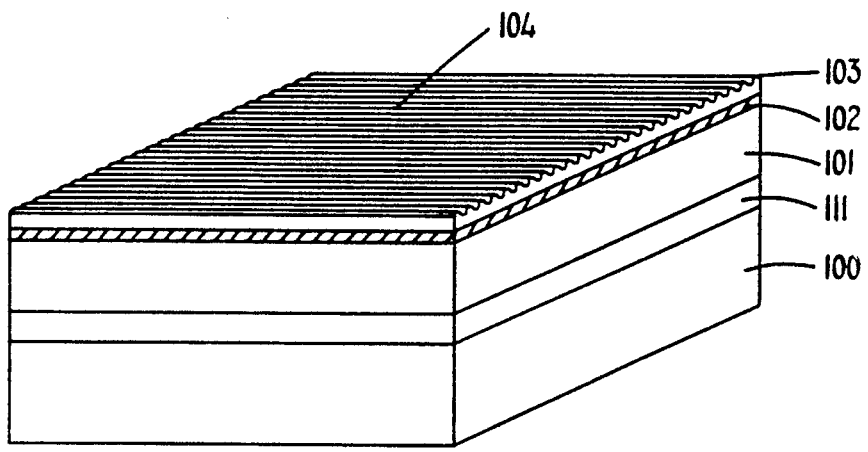
FIG. 16 is a perspective view illustrating a first crystal growth step and a step of forming a diffraction grating for producing the DFB semiconductor laser device of FIG. 15.

In a first crystal growth step, as is shown in FIG. 16, an n-GaAs buffer layer 111 (thickness: 0.5 μm), an n−$Al_xGa_{1-x}As$ first cladding layer 101 (thickness: 1.2 μm), an $Al_yGa_{1-y}As$ active layer 102 (thickness: 0.07 μm), and a p−$Al_zGa_{1-z}As$ optical waveguide layer 103 (thickness: 0.15 μm) are sequentially grown on a (100) facet of an n-GaAs substrate 100 by use of MOCVD.

The compositional ratio of Al in each layer composed of Al, Ga, and As is set so as to fulfill both relationships of $0<y<z<x<1$ and $z<0.4$. Due to such conditions, the forbidden band gap is largest in the first cladding layer 101 of the above three layers and smallest in the active layer 102, and the refractive index is smallest in the first cladding layer 101 and largest in the active layer 102. The waveguide layer 103 has a moderate value in each of these characteristics.

The above relationship regulating the compositional ratio of Al, Ga, and As of the first cladding layer 101, the active layer 102, and the optical waveguide layer 103 are also applicable to the DFB semiconductor laser devices of Examples 1, 2 and 3 although each compositional ratio of the first cladding layer, the active layer, and the optical waveguide layer is indicated by practical values in the previous three examples.

Next, as is shown in FIG. 16, an entire top surface of the optical waveguide layer 103 is treated by use of photolithography with an Ar ion laser holographic exposure device and a normal wet etching method to form a diffraction grating 104 in the [011] direction of the substrate 100. The period Λ should be set to fulfill the following formula:

$$\Lambda = m\lambda/2n_{eff} (m=1, 2, 3, \ldots)$$

where λ is the wavelength of the light emitted by the semiconductor laser device, and $n_{eff}$ is the equivalent refractive index of the optical waveguide region of the semiconductor laser. In Example 4, m=2, λ=780 nm, and $n_{eff}$=3.5. The period Λ is set to be 223 nm, referring to the value obtained from the above formula.

Figure 17:
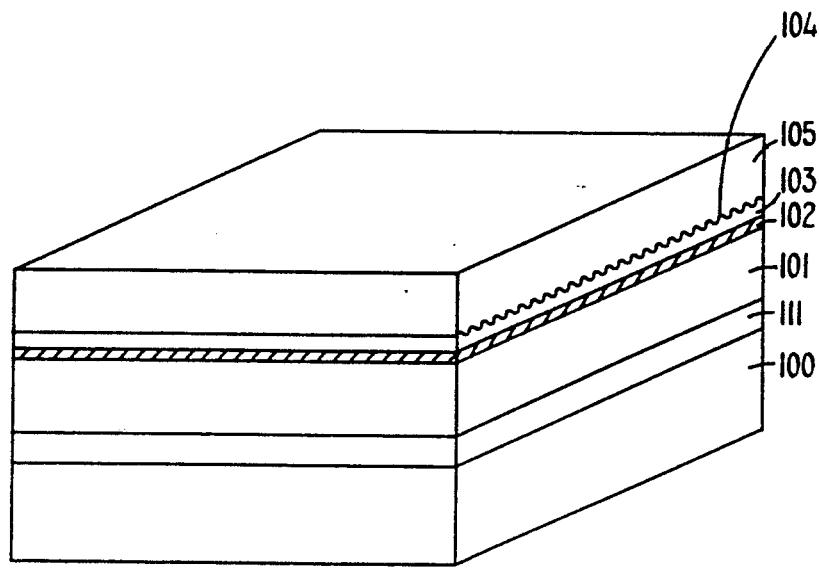
FIG. 17 is a perspective view illustrating a second crystal growth step for producing the DFB semiconductor laser device of FIG. 15.

In a second crystal growth step, as is shown in FIG. 17, a p−$Al_uGa_{1-u}As$ second cladding layer 105 (thickness: 1.2 μm) is grown on the optical waveguide layer 103 having the diffraction grating 104 by use of LPE.

The compositional ratio of the second cladding layer 105 is set to fulfill the formula of $z<0.4<u$. Although MOCVD is applicable instead of LPE, LPE is preferable because MOCVD may cause stress in grown crystals constituting the second cladding layer 105.

Figure 18:
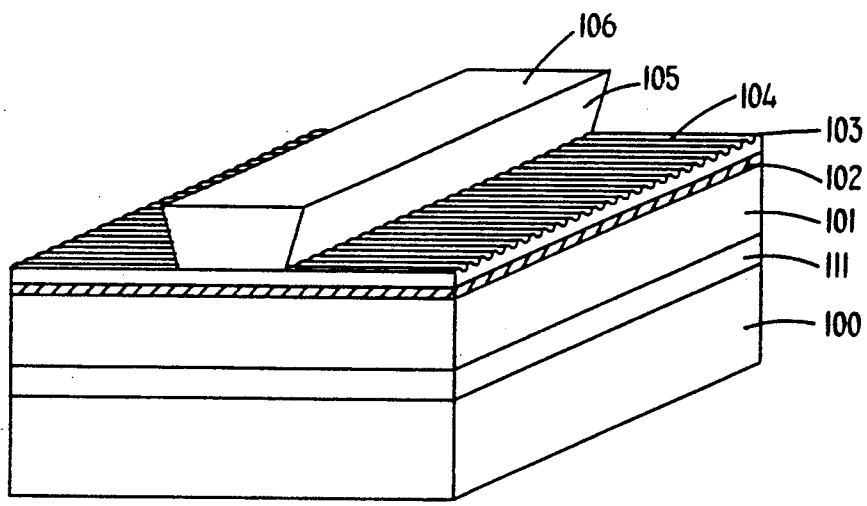
FIG. 18 is a perspective view illustrating a step of forming a mesa ridge for producing the DFB semiconductor laser device of FIG. 15.

Next, as is shown in FIG. 18, the second cladding layer 105 is etched by use of a conventional photolithographic method and a conventional etching method to form a mesa ridge 106 in the [011]direction of the substrate 100. As an etchant, a hydrofluoric acid solution is used. Such an etchant etches the second cladding layer 105 at a speed of approximately 20 nm/sec but hardly etches the optical waveguide layer 103 provided below the second cladding layer 105, thereby enabling selective etching. Therefore, the diffraction grating 104 formed in the foregoing step is exposed on the surface of the optical waveguide layer 103 in an area which is not covered with the mesa ridge 106. The mesa ridge 106, which defines the optical waveguide region, has a reverse mesa shape having an upper width of 5 μm, a lower width of 4 μm, and a height of 1.2 μm identical with the thickness of the second cladding layer 105.

In a third crystal growth step, an n-GaAs current block layer 107 (thickness: 0.9 μm) and a p-GaAs contact layer 108 (thickness: 1.5 μm) are sequentially grown by use of LPE on the optical waveguide layer 103 disposed on both sides of the mesa ridge 106. In the case when LPE is used, semiconductor crystals hardly grow on the mesa ridge 106 because the mesa ridge 106 is formed of $Al_uGa_{1-u}As$ ($0.4<u$) crystals and an extremely thin Al oxide film is formed thereon. The inventors of the present invention have confirmed through experiments that no crystal is grown on the mesa ridge 106 when the thickness of the current block layer 107 grown on the optical waveguide layer 103 is less than the height of the mesa ridge 106 and that crystal growth starts when the above total thickness exceeds the height of the mesa ridge 106. Owing to such a feature of the mesa ridge 106, the mesa ridge 106 is not completely buried by the current block layer 107 because the current block layer 107 is not grown on a top surface of the mesa ridge 106 The mesa ridge 106 is completely buried by the contact layer 108 grown on the current block layer 107.

Finally, an n-type ohmic electrode (not shown) is formed on a bottom surface of the substrate 100, and a p-type ohmic electrode (not shown) is formed on a top surface of the contact layer 108. The resulting wafer is cleaved into chips to produce the semiconductor layer device (resonator length: approximately 300 μm) shown in FIG. 15.

A multiple layer coating film having a reflectance of 80% is formed on a rear end surface of the above semiconductor laser device, and another coating film having a low reflectance of 5% is formed on a front end surface thereof. Thus, a high output power laser beam can be obtained.

The DFB semiconductor laser device produced in the above manner was evaluated for the current-output power characteristic. It was found out that the threshold current was approximately 45 mA and the differential quantum efficiency was 0.5 W/A. Further, the transverse mode of the light in the waveguide region is stabilized by the optical absorption effect of the current block layer 107, whereby the transverse mode can be controlled at up to an output power of 70 mW.

The method for producing the semiconductor laser device of Example 4 requires three steps of crystal growth and two steps of microscopic processing, but the emission characteristics only slightly deviate both between the wafers and in each wafer. For example, the production yield of wafers was 90% or more, and the average production yield of the semiconductor laser device in one wafer was 75% or more. As is indicated by these values, extremely high reproducibility and controllability are obtained by the method of Example 4.

Example 5

Figure 19:
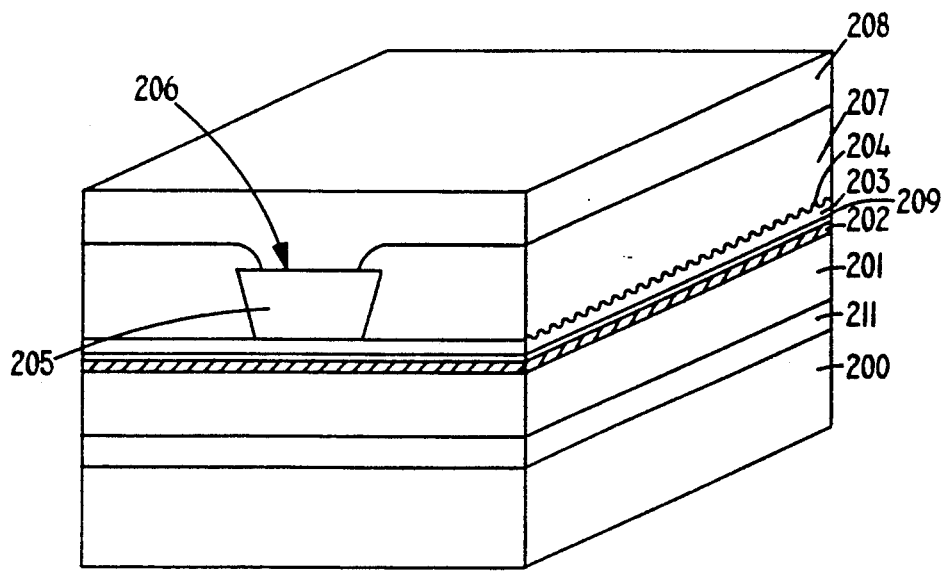
FIG. 19 is a schematic perspective view of a DFB semiconductor laser device produced in accordance with Example 5 of the present invention.

FIG. 19 shows a schematic construction of a DFB semiconductor laser device produced in accordance with Example 5 of the present invention. This DFB semiconductor laser device has an identical construction with that of the semiconductor laser device of Example 4 except that a $p-Al_vGa_{1-v}As$ ($z<v<0.7$) carrier barrier layer 209 is inserted between an active layer 202 and an optical waveguide layer 203. The semiconductor laser device of Example 5 is produced substantially in the same manner as in Example 4.

In a first crystal growth step, an n-GaAs buffer layer 211, an $n-Al_xGa_{1-x}As$ first cladding layer 201, an $Al_yGa_{1-y}As$ active layer 202, a $p-Al_vGa_{1-v}As$ carrier barrier layer 209, and a $p-Al_zGa_{1-z}As$ optical waveguide layer 203 are sequentially grown on a (100) facet of an n-GaAs substrate 200 in the same manner as in Example 4. The carrier barrier layer 209, which is inserted because the forbidden band gap of the optical waveguide layer 203 cannot be sufficiently large to completely prevent overflow of carriers, contributes to the improvement of the temperature characteristic (practically, to the increase of the characteristic temperature $T_0$) of the produced semiconductor laser device. The carrier barrier layer 209 preferably has a thickness of 0.05 to 0.3 μm, and is required to have a hole density of $5 \times 10^{17}$ cm$^{-3}$ or more. In fact, a temperature $T_0$ of 160° K. or more was obtained by inserting the carrier barrier layer 209.

Next, a diffraction grating 204 is formed in the same manner as in Example 4. In the second crystal growth step, a $p-Al_uGa_{1-u}As$ second cladding layer 205 (thickness: 1.5 μm) is grown on the optical waveguide layer 203 having the diffraction grating 204. A mesa ridge 206 is formed by use of an etchant composed of a hydrofluoric acid solution.

In the third crystal growth step, an n-GaAs current block layer 207 (thickness: 1.7 μm) is grown in the same manner as in Example 4 so as not to completely cover a top surface of the mesa ridge 206. Then, a p-GaAs contact layer 208 (thickness: 2.0 μm) is grown to completely bury the mesa ridge 206. Finally, an n-type ohmic electrode (not shown) is formed on a bottom surface of the substrate 200, and a p-type ohmic electrode (not shown) is formed on a top surface of the contact layer 208. The obtained wafer is cleaved into chips to produce the semiconductor layer device (resonator length: approximately 300 μm) shown in FIG. 19.

The DFB semiconductor laser device thus produced was evaluated for the emission characteristic to find out that the transverse mode can be controlled even at a high output power as in Example 4. The average production yield of the semiconductor laser device in the wafer was as high as approximately 75%.

Example 6

Figure 20:
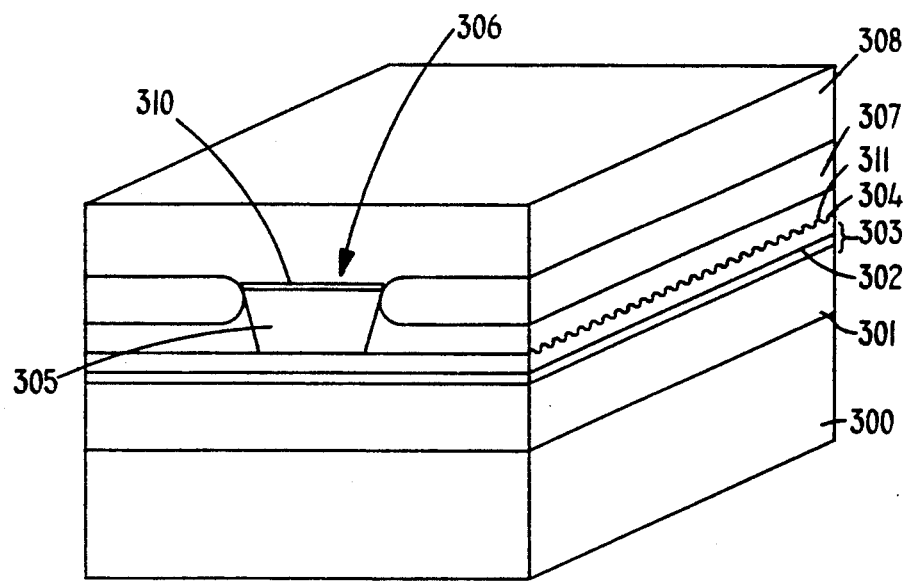
FIG. 20 is a schematic perspective view of a DFB semiconductor laser device produced in accordance with Example 6 of the present invention.
Figure 21:
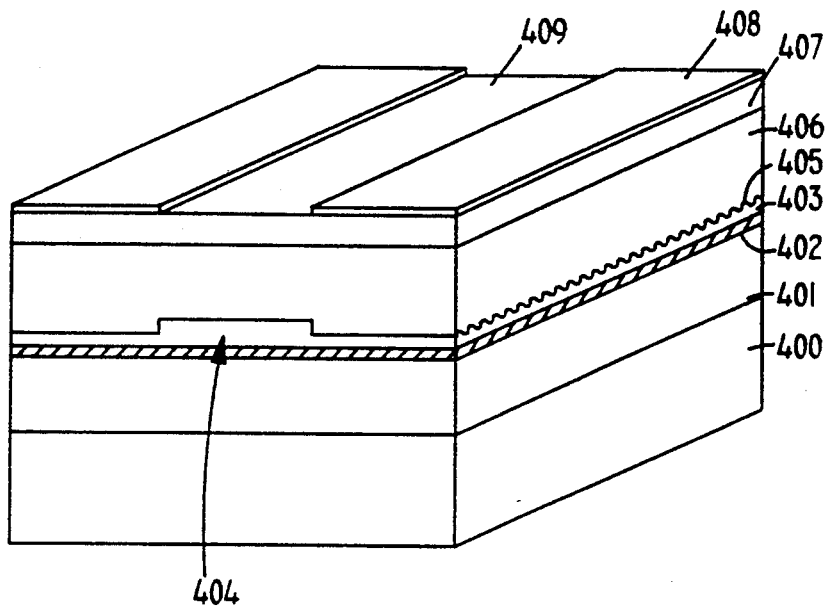
FIG. 21 is a schematic perspective view of another prior art DFB semiconductor laser device.
Figure 22:
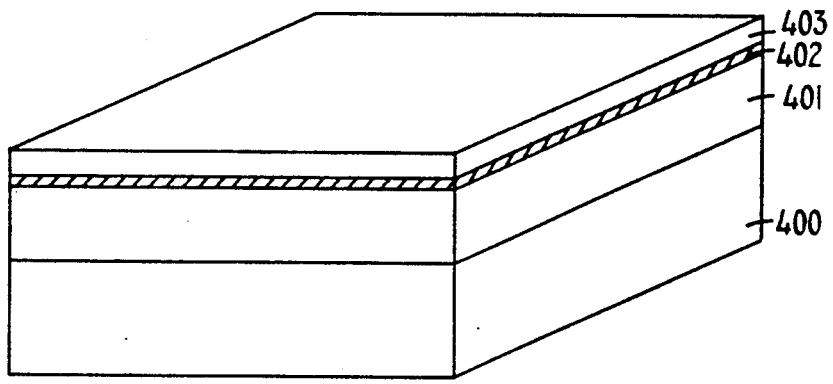
FIG. 22 is a perspective view illustrating a first crystal growth step for producing the prior art DFB semiconductor laser device of FIG. 21.
Figure 23:
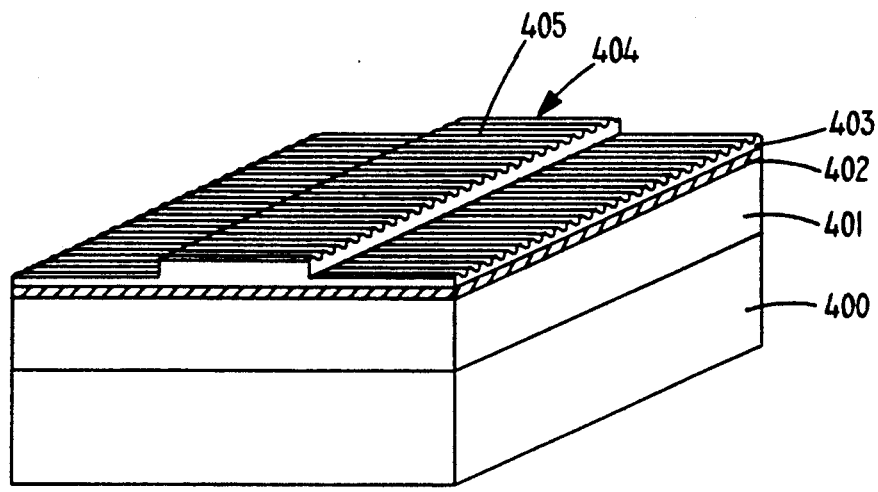
FIG. 23 is a perspective view illustrating a step of forming a diffraction grating for producing the prior art DFB semiconductor laser device of FIG. 21.
Figure 24:
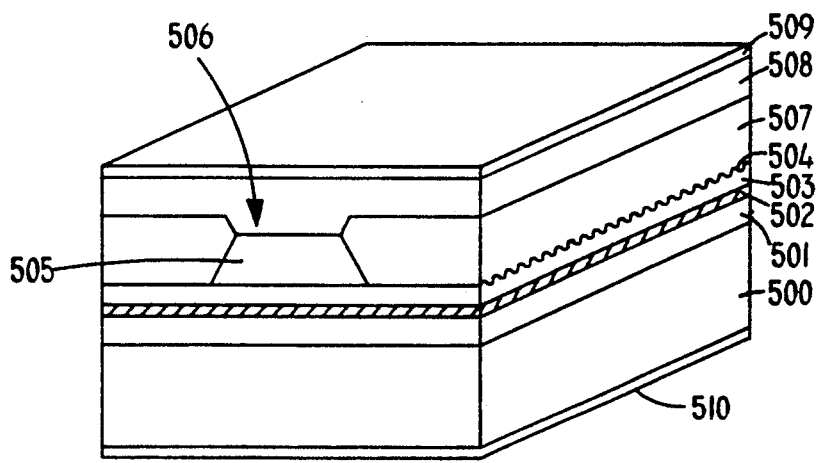
FIG. 24 is a schematic perspective view of still another prior art DFB semiconductor laser device.

FIG. 20 shows a schematic construction of a DFB semiconductor laser device produced in accordance with Example 6 of the present invention. The DFB semiconductor laser device of Example 6 is produced in the following manner.

In a first crystal growth step, a p-AlGaAs first cladding layer 301 (thickness: 1.2 μm) and a GaAs active layer 302 are sequentially grown on a (100) facet of a p-GaAs substrate 300. Immediately below and on the active layer 302, GRIN (graded index) layers 303 respectively including p-type and n-type GRIN regions (total thickness: 0.28 μm) are grown. The n-type GRIN region on the active layer 302 functions as an optical waveguide layer. Next, a diffraction grating 304 is formed on a surface area (width: 10 μm) of the n-type GRIN layer 303. The period Λ of diffracting grating is given by the formula: $\Lambda = m\lambda/2n_{\textit{eff}}$, where m=1, λ=780 nm, and $n_{\textit{eff}} = 3.5$.

In a second crystal growth step, a second cladding layer 305 (thickness: 1.2 μm) and an n-AlGaAs surface control layer 310 (thickness: 0.1 μm) are sequentially grown on the diffraction grating 304. The surface control layer 310 is provided in order to prevent first and second current block layers 311 and 307 from being grown on a top surface of a mesa ridge 306 in a third crystal growth step and also in order to allow a contact layer 308 to cover the top surface of the mesa ridge 306 with a high production yield. The surface control layer 310 preferably has a compositional ratio of Al in the range of 0.2 to 0.8.

Then, the mesa ridge 306 (width: 4 μm) is formed in the same manner as in Example 4. The mesa ridge 306 is controlled to be disposed at a substantial center of a surface area (width: 10 μm) of the n-type GRIN layer 303 having the diffraction grating 304.

In the third crystal growth step, the p-AlGaAs first current block layer 311 (thickness: 0.2 μm), the p-GaAs second current block layer 307 (thickness: 1.0 μm), and an n-GaAs contact layer 308 (thickness: 3.0 μm) are sequentially grown by use of LPE. Since the second cladding layer 305 has the surface control layer 310 on a top surface thereof as mentioned above, the current block layer 311 or 307 is not grown on the second cladding layer 305, and so the mesa ridge 306 is completely buried by the contact layer 308.

The first current block layer 311 is provided in order to reduce the absorption loss of the light in the optical waveguide region to some extent. In the case when a current block region including a p-GaAs layer sandwiched between p-AlGaAs layers is employed, the current can be blocked more effectively, thereby improving the production yield of the semiconductor laser device.

A p-type electrode (not shown) is formed on a bottom surface of the substrate 300 and an n-type electrode (not shown) is formed on a top surface of the contact layer 308, and then the resulting wafer is cleaved into chips to produce the semiconductor laser device (resonator length: approximately 300 μm) shown in FIG. 20.

The DFB semiconductor laser device thus produced was evaluated for the current-output power characteristic. It was found out that the threshold current was approximately 35 mA and the differential quantum efficiency was 0.7 W/A. Further, the transverse mode of the light in the waveguide region is stabilized by the optical absorption effect of the current block layers 311 and 307, whereby the transverse mode can be controlled at up to an output power of 50 mW.

According to the methods of Examples 4, 5, and 6, the diffraction grating is formed at a surface of the flat optical waveguide layer, and then a mesa ridge and a current block layer for controlling the transverse mode is formed, thereby forming the current injection path and the waveguide region in self alignment. Accordingly, a uniform diffraction grating is obtained, and further highly precise positional alignment of the current injection path and the waveguide region is realized. Moreover, the production method requires only three crystal growth steps.

The uniformity of the diffraction grating and the three-step production method realizes high-yield production of a DFB semiconductor laser device having a mesa ridge which is excellent in emission characteristic.

The highly precise positional alignment of the current injection path and the waveguide region realizes a semiconductor laser device which is capable of stable control of the transverse mode at up to a high output power of 20 mW or more.

As the growth method used in each crystal growth step according to the present invention, an appropriate method may be chosen from the known technologies such as chemical vapor deposition (CVD), MOCVD, molecular beam epitaxy (MBE), gas source MBE, and LPE. For the second and the third crystal growth steps, especially for the third crystal growth step, LPE is preferable. In the third step, by employing the control conditions to prevent crystals from substantially growing in a portion of a top surface or a side surface of the mesa ridge, the current block layer can selectively be grown on the optical waveguide layer having the diffraction grating disposed on both sides of the mesa ridge. In the case when the crystal growth is performed thereafter under appropriate conditions, a contact layer can be formed on an entire top surface of the current block layer including the top surface of the mesa ridge.

In the DFB semiconductor laser device produced in a method according to the present invention, the substrate and each layer are preferably formed of AlGaAs/GaAs semiconductor materials. Especially, the first cladding layer and the optical waveguide layer are formed of a material having a larger forbidden band gap and a lower refractive index than a material used for the active layer. The second cladding layer on which the mesa ridge is to be provided is formed of a material which has a larger forbidden band gap and can be etched at a sufficiently higher speed than the optical waveguide layer when being etched by a certain etchant such as a hydrofluoric acid (HF) solution.

The diffraction grating is formed at the optical waveguide layer by forming a periodical corrugation at a surface of the optical waveguide layer. As the area of the surface at which the periodical corrugation is formed, an area which is only wider than the area which acts as the waveguide region in a direction perpendicular to the waveguide direction is sufficient. It is not necessary to form the corrugation at the entire surface of the optical waveguide layer. The period of the diffraction grating is substantially set to a multiple product of an integer of half the wavelength of the desirable light.

The structure of the active layer is not limited to one of the above examples, but may be, for example, a double heterostructure, in which the active layer is interposed between a pair of cladding layers or a pair of cladding layers and a pair of GRIN layers. A multiple quantum well structure or a GRIN single quantum well structure may be employed. A carrier barrier layer may be inserted between the active layer and the optical waveguide layer. In this case, the temperature characteristic of the semiconductor laser device can be improved, namely, the characteristic temperature $T_0$ can be raised.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a distributed feedback semi-conductor laser device including a structure for controlling a longitudinal mode of light to be emitted and a structure for controlling a transverse mode of the light, the method comprising:

a first crystal growth step of sequentially growing a first cladding layer of a first conductive type, an active layer, and an optical waveguide layer of a second conductive type on a semiconductor substrate of the first conductive type;

a step of forming a diffraction grating at a surface of the optical waveguide layer;

a second crystal growth step of growing a current block layer of the first conductive type on the optical waveguide layer having the diffraction grating, said second crystal growth step includes a step of forming an etching stop layer on the optical waveguide layer;

a step of selectively etching the current block layer to expose the diffraction grating and thus to form a stripe groove; and a third crystal growth step of growing a second cladding layer of the second conductive type on the diffraction grating inside the stripe groove and on the current block layer.

2. A method for producing a distributed feedback semi-conductor laser device according to claim 1, wherein the etching stop layer is formed of a semiconductor layer of the second conductive type.

3. A method for producing a distributed feedback semiconductor laser device according to claim 1, wherein the second crystal growth step includes a step of forming a support layer on the current block layer.

4. A method for producing a distributed feedback semiconductor laser device according to claim 3, wherein the support layer is formed of a semiconductor layer of the second conductive type.

5. A method for producing a distributed feedback semiconductor laser device according to claim 1, wherein the first crystal growth step includes a step of forming a support layer on the optical waveguide layer, and the support layer remains on a top portion of the diffraction grating.

6. A method for producing a distributed feedback semiconductor laser device according to claim 1, wherein the second crystal growth step includes a step of forming a support layer having a substantially uniform thickness on the optical waveguide layer having the diffraction grating.

7. A method for producing a distributed feedback semi-conductor laser device include a structure for controlling a longitudinal mode of light to be emitted and a structure for controlling a transverse mode of the light, the method comprising:

a first crystal growth step of sequentially growing a first cladding layer of a first conductive type, an active layer, and an optical waveguide layer of a second conductive type on a semiconductor substrate of the first conductive type;

a step of forming a diffraction grating at a surface of the optical waveguide layer;

a second crystal growth step of sequentially growing a first semiconductor layer of the second conductive type and a current block layer of the first conductive type on the optical waveguide layer having the diffraction grating, said second crystal growth step including a step of forming an etching stop layer on the optical waveguide layer;

a step of selectively etching the current block layer to expose the first semiconductor layer and thus to form a stripe groove; and a third crystal growth step of growing a second semiconductor layer of the second conductive type on the first semiconductor layer inside the stripe groove and on the current block layer to form a second cladding layer.

8. A method for producing a distributed feedback semiconductor laser device according to claim 7, wherein the etching stop layer is formed of a semiconductor layer of the second conductive type.

9. A method for producing a distributed feedback semiconductor laser device according to claim 7, wherein the second crystal growth step includes a step of forming a support layer on the current block layer.

10. A method for producing a distributed feedback semiconductor laser device according to claim 9, wherein the support layer is formed of a semiconductor layer of the second conductive type.

11. A method for producing a distributed feedback semiconductor laser device including a structure for controlling a longitudinal mode of light to be emitted and a structure for controlling a transverse mode of the light, the method comprising:

a first crystal growth step of sequentially growing a first cladding layer of a first conductive type, an active layer, and an optical waveguide layer of a second conductive type on a semiconductor substrate of the first conductive type;

a step of forming a diffraction grating at a surface of the optical waveguide layer;

a second crystal growth step of growing a second cladding layer of the second conductive type on the optical waveguide layer having the diffraction grating, said second crystal growth step including a step of forming an etching stop layer on the optical waveguide layer;

a step of selectively etching the second cladding layer to expose the diffraction grating and thus to form a mesa ridge; and a third crystal growth step of selectively growing a current block layer of the first conductive type on the optical waveguide layer disposed on both sides of the mesa ridge.

12. A method for producing a distributed feedback semiconductor laser device according to claim 11, wherein the second crystal growth step is performed by use of liquid phase epitaxy.

13. A method for producing a distributed feedback semiconductor laser device according to claim 11, wherein the third crystal growth step is performed by use of liquid phase epitaxy.

* * * * *

UNITED STATES PATENT AND TRADEMARK OFFICE
CERTIFICATE OF CORRECTION

PATENT NO.   : 5,292,685
DATED        : March 8, 1994
INVENTOR(S)  : Kazuhiko Inoguchi et al.

It is certified that error appears in the above-indentified patent and that said Letters Patent is hereby corrected as shown below:

In the Drawings:

In Figure 5, reference number "20" should read --25--.

Signed and Sealed this

Fifth Day of July, 1994

*Attest:*

BRUCE LEHMAN

*Attesting Officer*        *Commissioner of Patents and Trademarks*